United States Patent [19]

Moll et al.

[11] Patent Number: 5,055,891
[45] Date of Patent: Oct. 8, 1991

[54] HETEROSTRUCTURE TRANSISTOR USING REAL-SPACE ELECTRON TRANSFER

[75] Inventors: Nicolas J. Moll, La Honda; Mark R. Hueschen, Los Altos; Marek E. Mierzwinski, Stanford, all of Calif.

[73] Assignee: Hewlett-Packard Company, Palo, Calif.

[21] Appl. No.: 532,485

[22] Filed: May 31, 1990

[51] Int. Cl.[5] .......................................... H01L 29/161
[52] U.S. Cl. ........................................ 357/16; 357/34
[58] Field of Search ...................... 357/16, 34, 34 HB

[56] References Cited

U.S. PATENT DOCUMENTS

| | | | |
|---|---|---|---|
| 4,257,055 | 3/1981 | Hess et al. | 357/16 |
| 4,727,403 | 2/1988 | Hida et al. | 357/16 |
| 4,758,870 | 7/1988 | Hase et al. | 357/16 |
| 4,806,998 | 2/1989 | Vinter et al. | 357/16 |
| 4,807,001 | 2/1989 | Hida | 357/16 |
| 4,827,320 | 5/1989 | Morkoc et al. | 357/16 |
| 4,862,228 | 8/1989 | Ralph | 357/16 |
| 4,903,092 | 2/1990 | Luryi et al. | 357/22 |

FOREIGN PATENT DOCUMENTS

| | | | |
|---|---|---|---|
| 151309A | 8/1985 | European Pat. Off. | |
| 62-219967 | 9/1987 | Japan | 357/16 |
| 166972 | 3/1989 | Japan | 357/16 |
| 174765 | 3/1989 | Japan | 357/16 |

OTHER PUBLICATIONS

K. Hess, H. Morkoc, H. Shichijo and B. G. Streetman, "Negative Differential Resistance Through Real-Space Electron Transfer", 9/15/79, Applied Physics Letters, 35(6).

M. Keever, H. Shichijo, K. Hess, S. Banerjee, L. Witkowski, H. Morkoc, and B. G. Streetman, "Measurements of Hot-Electron Conduction and Real-Space Transfer in GaAs-Al$_x$Ga$_{1-x}$ Heterojunction Layers", 1/1/81, Applied Physics Leters, 38(1).

M. Keever, K. Hess and M. Ludowise, "Fast Switching and Storage in GaAs-Al$_x$A$_{1-x}$ Heterojunction Layers", 10/10/82, IEEE Electron Device Letters, vol. EDI-3, No. 10.

A. Katalsky, J. H. Abeles, R. Bhat, W. K. Chan, and M. A. Koza, "High Frequency Amplification and Generation in Charge Injection Devices", 1/1/86, Applied Physics Letters, 48(1).

S. Luryi, A. Katalsky, A. Gossard and R. Hendel, "Charge Injection Transistor Based on Real-Space Hot-Electron Transfer", 6/84, IEEE Transactions on Electron Devices, vol. ED-31, No. 6.

*Primary Examiner*—Jerome Jackson, Jr.
*Assistant Examiner*—Hung Xuan Dang

[57] ABSTRACT

A charge injection transistor is a real-space electron transfer heterostructure with several novel features. The channel layer is comprised of In$_{0.25}$Ga$_{0.75}$As supported by a buffer layer of Al$_{0.3}$Ga$_{0.7}$As resting on the substrate. A barrier layer comprised of Al$_{0.1}$Ga$_{0.9}$As overlays the channel layer. Over this barrier is a layer of GaAs forming the electron drift region. The collector electrode is located on top of this drift layer, between the source and heater electrodes, which extend downward through the drift and barrier layers and create the electric field in the channel layer. Positive voltages are applied to the heater and collector, relative to the source. Electrons flow through the channel region and become heated. At sufficiently high temperature they escape over the barrier and travel through the drift region to the collector. In comparison with previous devices, the use of InGaAs in the channel layer provides a deeper quantum well for the conduction electrons, and suppresses leakage through the barrier at room temperatures. The collector drift layer has a short transit time delay. The location of the collector reduces parasitic leakage from the source, and the collector capacitance is small. These features enhance the high frequency performance of the device. The limiting power gain frequency and current gain frequency are at least twice the corresponding values attained in previous devices.

10 Claims, 4 Drawing Sheets

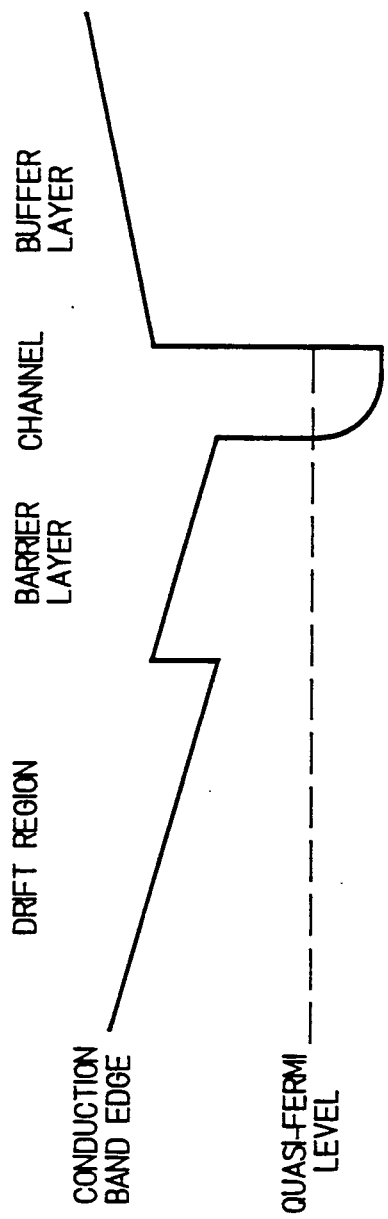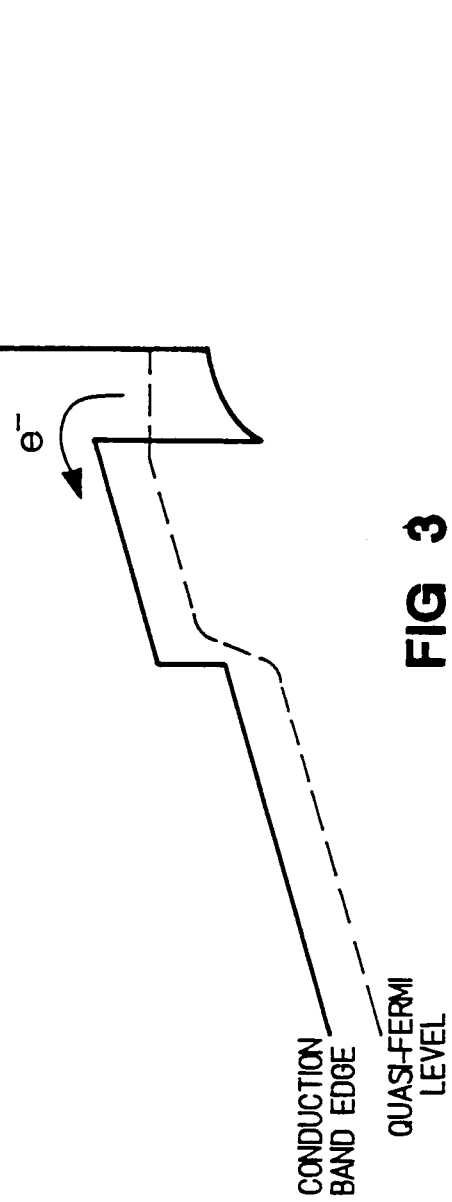

HETEROSTRUCTURE TRANSISTOR USING REAL-SPACE ELECTRON TRANSFER

BACKGROUND OF THE INVENTION

The invention pertains generally to the field of electronic transistors, and more particularly to heterostructure transistors operating by transfer of electrons across an interface between different semiconductor materials.

Heterostructure semiconductor devices have enjoyed considerable interest in the last several years as candidates for high-speed switches and for transistors that can generate and amplify high frequency electronic signals. One class of these devices operates on the principle of transfer of hot electrons between two different semiconductor layers separated by a potential barrier, where the temperature of the electrons is controlled by an applied electric field. Because the temperature of these electrons responds very rapidly to the applied field, and because the transit time of these electrons can be very short, such devices offer the promise of very high frequency operation.

These heterostructure devices have evolved from the well-known Gunn diode, which is a monolithic semiconductor structure that also employs a "transferred electron" mechanism. In the Gunn diode, a semiconductor material has a filled valence band and a partially filled conduction band. This conduction band has a central minimum-energy valley of electron states that are occupied up to the Fermi level, and one or more "satellite-valleys" at higher energies that are normally unoccupied. An example of such a material is GaAs, where the satellite valley minimum is 360 meV above the central valley minimum. If the GaAs is subjected to an electric field sufficiently large to give some of the conduction electrons more energy than this energy gap, they can be transferred into, and remain in, the satellite valley. Being in a different region of quasi-momentum space (or "k-space"), these satellite valley electrons have a different effective mass, which in GaAs is about 20 times higher than that in the central valley. The corresponding electron mobility is much smaller than that of the central valley electron states. The conductivity of the electrons is therefore reduced by the field, and the material exhibits a negative differential resistance. Semiconductor materials exhibiting such nonlinear behavior can be used to construct electronic oscillators, amplifiers, and switching and storage devices.

The heterostructure devices of interest comprise adjacent layers of different semiconductor materials in which the conduction bands of the materials have different mobilities. Instead of transferring electrons into lower mobility states in k-space, the applied electric field causes the conduction electrons in a high-mobility material to become heated and transferred in "real space" into an adjacent material of lower mobility. This means, again, that the conductivity of these electrons is effectively reduced by the applied field, and these heterostructures also exhibit negative differential resistance.

Negative resistance heterostructures have been disclosed in U.S. Pat. No. 4,257,055 (Hess et al.), and are described also in the following articles: "Negative Differential Resistance Through Real-Space Electron Transfer", K. Hess, H. Morkoc, H. Shichijo and B. G. Streetman, Appl. Phys. Lett. 35 (6), Sept. 15, 1979; "Measurements of Hot-Electron Conduction and Real-Space Transfer in GaAs-Al$_x$Ga$_{1-x}$ Heterojunction Layers", M. Keever, H. Shichijo, K. Hess, S. Banerjee, L. Witkowski, H. Morkoc, and B. G. Streetman, Appl. Phys. Lett. 38 (1), Jan. 1, 1981; "Fast Switching and Storage in GaAs-Al$_x$Ga$_{1-x}$ Heterojunction Layers", M. Keever, K. Hess and M. Ludowise, IEEE Electron Device Letters, Vol. EDL-3, No. 10, October 1982. These references all describe semiconductor heterostructures having adjacent alternate layers of high-mobility GaAs and low-mobility Al$_x$Ga$_{1-x}$As. Conduction electrons are supplied by donors in the Al$_x$Ga$_{1-x}$As and migrate to the GaAs layer, which has a smaller band gap and lower scattering. When an electric field is applied in a direction parallel to the interface between the layers, the electrons in the conduction band of the GaAs will be rapidly heated to energies well above their thermal equilibrium value, and acquire sufficient energy to overcome the conduction band discontinuity between the two materials and move back into the Al$_x$Ga$_{1-x}$As layer. This propagation can be described as a kind of thermionic emission. Once these electrons reach the low-mobility layer their conductivity is reduced and the heterostructure displays the negative differential resistance described above.

The above references describe the basic principles of real-space electron transfer and their application to switching and storage devices. These principles are well understood for the most part, although some of the details have yet to be elucidated, such as the precise physical location at which the electrons transfer. Interest has been growing in the application of these principles in order to design transistors that can amplify and generate high frequency signals.

One transistor design based on these principles is described in the article "Charge Injection Transistor Based on Real-Space Hot-Electron Transfer", S. Luryi, A. Katalsky, A. Gossard and R. Hendel, IEEE Transactions on Electron Devices, Vol. ED-31, No. 6, June 1984. This reference describes a transistor having a conducting n-GaAs substrate that acts as the collector of the device. Over this substrate is grown an undoped Al$_x$Ga$_{1-x}$As barrier layer, then an undoped GaAs channel layer, and a layer of n-Al$_{0.34}$Ga$_{0.66}$As which provides a source of electrons, capped by an n-GaAs layer. A source electrode (serving as the "emitter") and a drain electrode ("base") extend downward through the top three layers into, but not through, the barrier layer. A gate electrode is also provided, extending through the cap into the electron source layer. This gate allows the device to function in a negative resistance field effect transistor mode (NERFET), as well as a charge injection transistor mode (CHINT). In the charge injection mode, which extends to higher frequency operation, this gate is not used and will not be discussed further here.

In the CHINT mode of operation with a common base (drain) configuration, positive voltages (with respect to the drain) are applied to the source and collector electrodes. The source-drain field causes an electron flow in the channel layer and raises the temperature of these electrons. They are normally confined to the channel layer, until the temperature becomes sufficiently high that they can overcome the barrier layer. The hot electrons are thereby injected by thermionic emission into the barrier layer region and drift to the substrate collector. As the drain voltage increases, the drain current initially rises, and then decreases as the electron temperature exceeds the barrier height and the collector current rises.

The transistor structure described in this Luryi reference has several limitations. One problem arises from parasitic leakage, i.e. direct injection of electrons from the source electrode into the collector. Another limitation arises from the delay time caused by the electron time of flight in the channel and barrier. A third limitation arises from the large capacitance between the substrate collector and the source (or drain). All of these limitations adversely affect the high frequency performance of this device. An improved version of this transistor structure is described in the article "High-Frequency Amplification and Generation in Charge Injection Devices", A. Katalsky, J. H. Abeles, R. Bhat, W. K. Chan, and M. A. Koza, Appl. Phys. Lett. 48 (1), Jan. 6, 1986. These references report measurements on CHINT devices indicating power gain up to 9.8 GHz and extrapolated current gain up to 29 GHz. These appear to be the upper frequency limits for CHINT devices attained to date.

SUMMARY OF THE INVENTION

The present real-space electron transfer heterostructure is a charge injection transistor that has several novel features, compared to the foregoing art. The channel layer is comprised of $In_{0.25}Ga_{0.75}As$ supported by a buffer layer of $Al_{0.3}Ga_{0.7}As$ resting on the substrate. This buffer layer prevents the hot channel electrons from escaping downward. A barrier layer comprised of $Al_{0.1}Ga_{0.9}As$ overlays the channel layer. Over this barrier is a layer of GaAs forming the electron drift region. The collector electrode is located on top of this drift layer. The collector is situated between the source and heater electrodes, which extend downward through the drift and barrier layers and create the electric field in the channel layer. (The "heater" electrode serves the same purpose as the "drain" electrode described in the above references; the difference is merely nomenclature.)

In a grounded source configuration, positive voltages are applied to the heater and collector. Electrons flow through the channel region and become heated. At sufficiently high temperature they escape over the barrier and travel through the drift region to the collector. This mechanism is entirely analogous to the operation of the Luryi device described previously.

The structure of the present device differs from the Luryi structure in several important respects. The use of InGaAs in the channel layer provides a deeper quantum well for the conduction electrons and suppresses leakage through the barrier at room temperatures. The collector drift layer is primarily GaAs, which has a shorter transit time delay. The location of the collector, on top of the wafer, reduces parasitic leakage from the source, and the collector capacitance is smaller. All of these features enhance the high frequency performance of the device. The unity power gain and current gain frequencies are substantially twice the corresponding values in the Luryi device.

Accordingly, it is an object of this invention to provide a heterostructure charge injection transistor having a reduced leakage of electrons out of the channel quantum well at room temperature.

A second object of this invention is to provide such a transistor having a short transit time delay for the electrons traveling through the drift region to the collector.

Another object of this invention is to provide such a transistor having a reduced parasitic leakage of electrons from the source to the collector.

A further object of this invention is to provide such a transistor having a reduced collector capacitance.

Yet another object of this invention is to provide such a transistor having a useful gain at very high frequencies.

These and other objects, features and characteristics of the invention may be further understood by references to the detailed description of the preferred embodiment, together with the appended drawings.

BRIEF DESCRIPTION OF THE DRAWINGS

FIG. 2 shows a partial band diagram of the heterostructure transistor for zero bias conditions. The solid line is the conduction band edge, and the dashed line is the electron quasi-Fermi level.

FIG. 3 shows a partial band diagram of the heterostructure transistor under operating bias conditions. The solid line is the conduction band edge, and the dashed line is the electron quasi-Fermi level.

DETAILED DESCRIPTION OF THE PREFERRED EMBODIMENT

Figure 1:
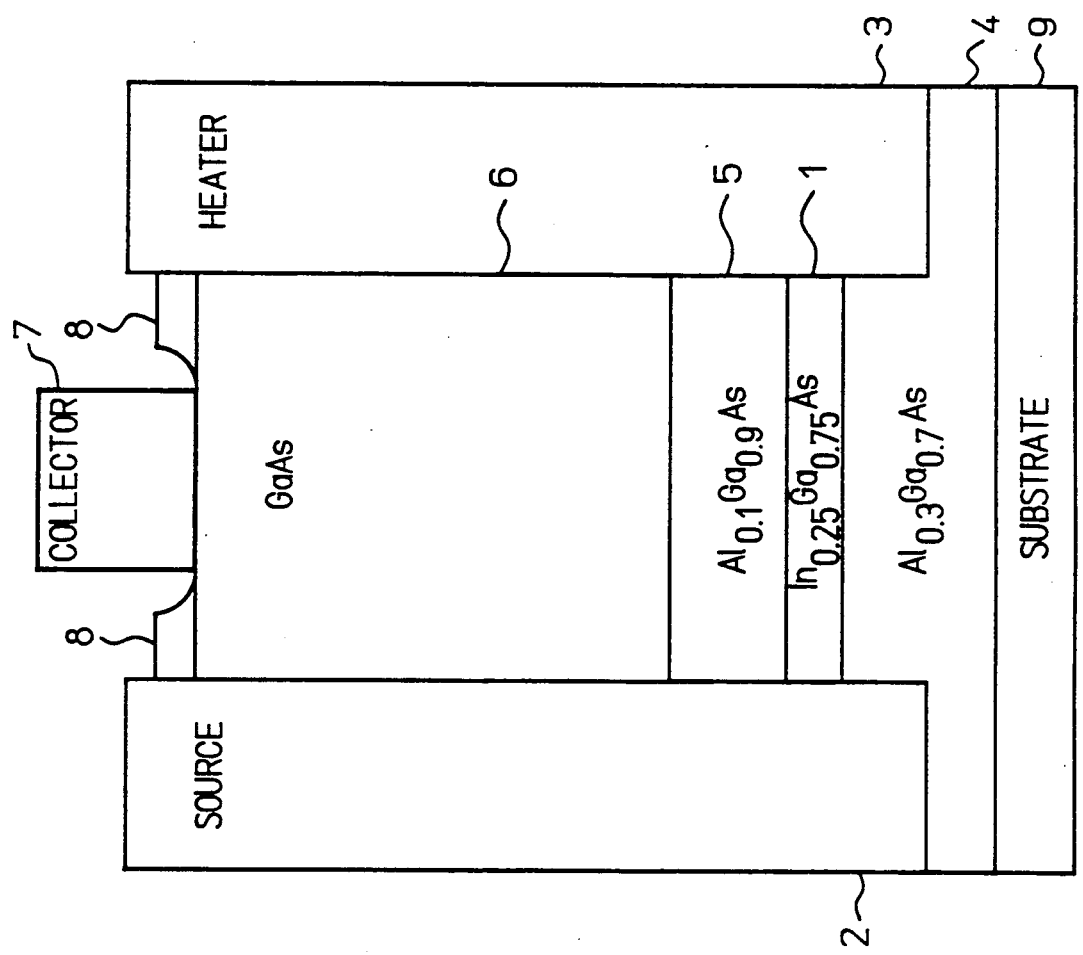
FIG. 1 is a schematic sectional view of a heterostructure transistor according to this invention.

Referring now to FIG. 1, there is shown an illustrative embodiment of a heterostructure transistor in a schematic cross-section. This device comprises a plurality of layers of semiconductor materials on a substrate, with electrodes connected to the layers at certain locations. These layers may be grown on a substrate by molecular beam epitaxy using conventional techniques.

The structure shown in FIG. 1 is a charge injection transistor having a quantum well channel layer 1 in which the electrons are heated. The electrons may be supplied by doping or other well-known means. This channel layer may preferably be fabricated of $In_{0.25}Ga_{0.75}As$, with a thickness of 100 Angstroms. It is connected to a source electrode 2 and a heater electrode 3, and a voltage difference applied to these electrodes causes a current in this channel layer and increases the temperature of the conduction electrons. Generally the heater is driven at a positive voltage with respect to the source.

The channel layer 1 is supported by a buffer layer 4, which is grown on top of the wafer substrate 9. This buffer layer 4 is comprised of $Al_{0.3}Ga_{0.7}As$, graded to zero Aluminum content at the substrate side, and it is of sufficient thickness to prevent the downward escape of heated electrons from the channel layer. The substrate and buffer layer are substantially insulating materials in contrast to previous charge injection devices.

A barrier layer 5 is grown over the channel layer and is fabricated of $Al_{0.1}Ga_{0.9}As$. This layer preferably has a thickness of 400 Angstroms, which is sufficient to essentially eliminate any tunneling of electrons upward from the channel layer when the electrons are at room temperature. The barrier layer is covered by a drift region layer 6, which is made of GaAs. This drift region has a thickness of 2,100 Angstroms. The collector electrode 7 is in electrical contact with the upper surface of the drift region layer and is preferably a small contact recessed into this surface. The remainder of this surface is capped with a 280 Angstrom thick layer of n-GaAs, 8. As shown in FIG. 1, the source and heater electrodes also extend upward through the drift layer. Mesa etching provides isolation. The source and heater contacts may be Au/Ge/Ni-based, alloyed ohmic contacts. The collector contact may be a Ti/Au Schottky barrier.

Referring now to FIGS. 2 and 3, the band diagram of the relevant part of the above-described semiconductor structure is shown at thermal equilibrium (FIG. 2) and under operating bias conditions (FIG. 3). In the unbiased state the electrons migrating from donor atoms are trapped in the quantum well channel. The depth of this channel is increased by the presence of Indium in the channel semiconductor material. Assuming the source electrode is grounded, a positive potential applied to the heater electrode causes a current flow in the channel layer, and the electron temperature in this layer increases. These electrons remain trapped in the channel layer and flow from the source to the heater.

When a positive voltage is applied to the collector, the band structure is altered as shown in FIG. 3. A collector voltage of 2 volts will produce substantially the configuration shown for the structure described herein. At room temperature the conduction electrons remained trapped in the channel layer by the triangular barrier. However the presence of a source current will cause these electrons to become heated, and the hotter electrons can escape over the barrier. These electrons then travel through the high-mobility drift region to the collector and produce a collector current. Because the number of escaping electrons is a sensitive function of the channel electron temperature, which is controlled by the heater voltage, the differential collector/heater current gain is seen to be greater than unity. In short, the structure described here functions as a charge-injection transistor (CHINT).

The transistor described above has been fabricated and its operating characteristics were measured over a frequency range from 125 MHz up to 25 Ghz. Bias voltages were applied to the heater and collector in a grounded source configuration. The heater voltage was 0.8 volts, and the heater current was 6.7 milliamperes. The collector voltage was 2 volts and the collector current was 30.7 milliamperes. The transfer matrix (S-parameters) was measured over the above frequency range for small-amplitude signals, and these parameters were used to calculate the gain and other parameters of the transistor.

Figure 4:
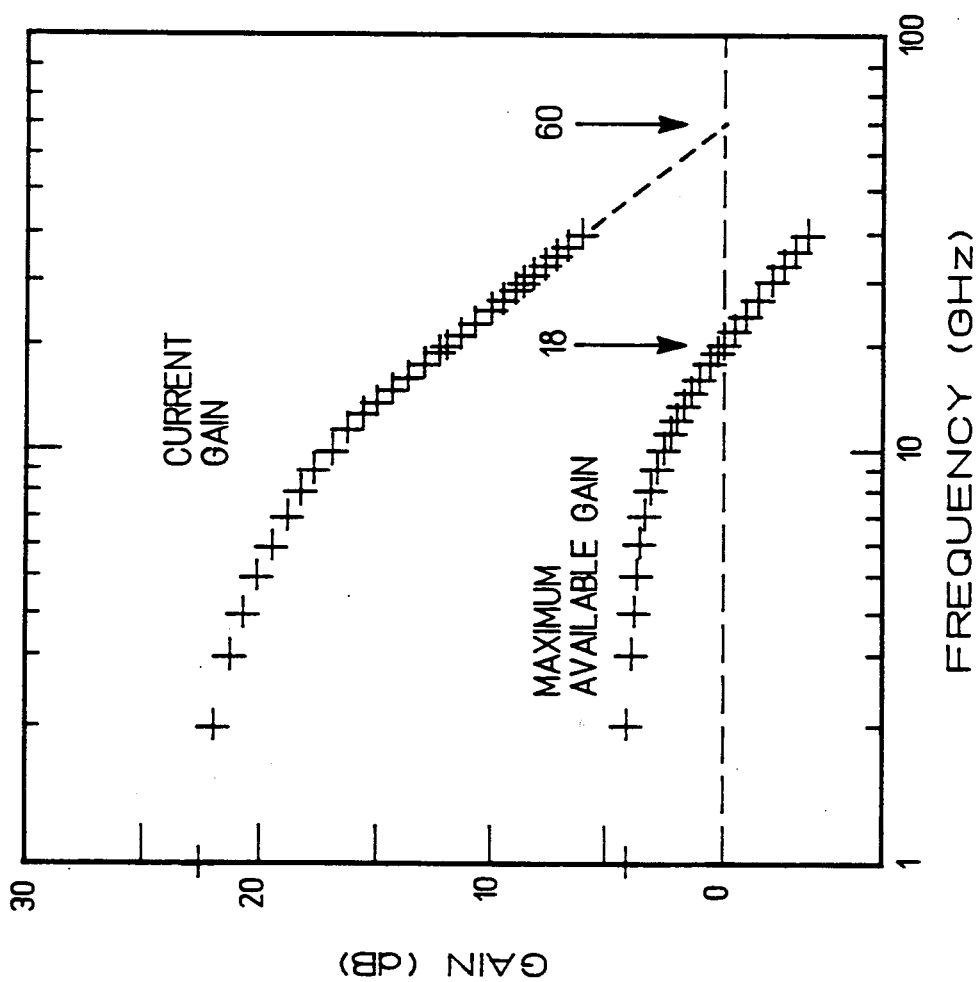
FIG. 4 is a semi-log plot of the current gain and maximum available gain versus frequency for the embodiment of the heterostructure transistor according to the detailed description herein.

FIG. 4 shows a graph of the current gain and the maximum available gain as a function of frequency, obtained in the above manner. The current gain is ratio of the differential collector current to the differential heater current in a grounded source configuration when the collector is ac short-circuited to ground and the heater is driven by a signal voltage, all under the above bias conditions. The maximum available gain is defined as the power gain when the transistor is conjugate matched to source and load (*IEEE Standard Dictionary of Electrical and Electronic Terms*, 2nd Edition; IEEE, New York, 1984). This refers to a circuit configuration in which a load impedance is inserted in the collector circuit and an input impedance is inserted in the heater circuit, and both impedances are matched to the transistor output and input impedances at a given frequency. The maximum available gain is the ratio of the signal power delivered to the load to the signal power absorbed by the transistor from the driving source under these conditions. In FIG. 4 the gains are plotted in terms of decibels, so that zero dB corresponds to a gain of unity. The maximum available gain is found to exceed unity for all frequencies up to 18 GHz. The current gain is well above unity for all measured frequencies, and the dashed line in FIG. 4 is the 20 dB per decade extrapolation of the high frequency current gain results. This extrapolated gain decreases to unity at a frequency of 60 GHz.

Figure 5:
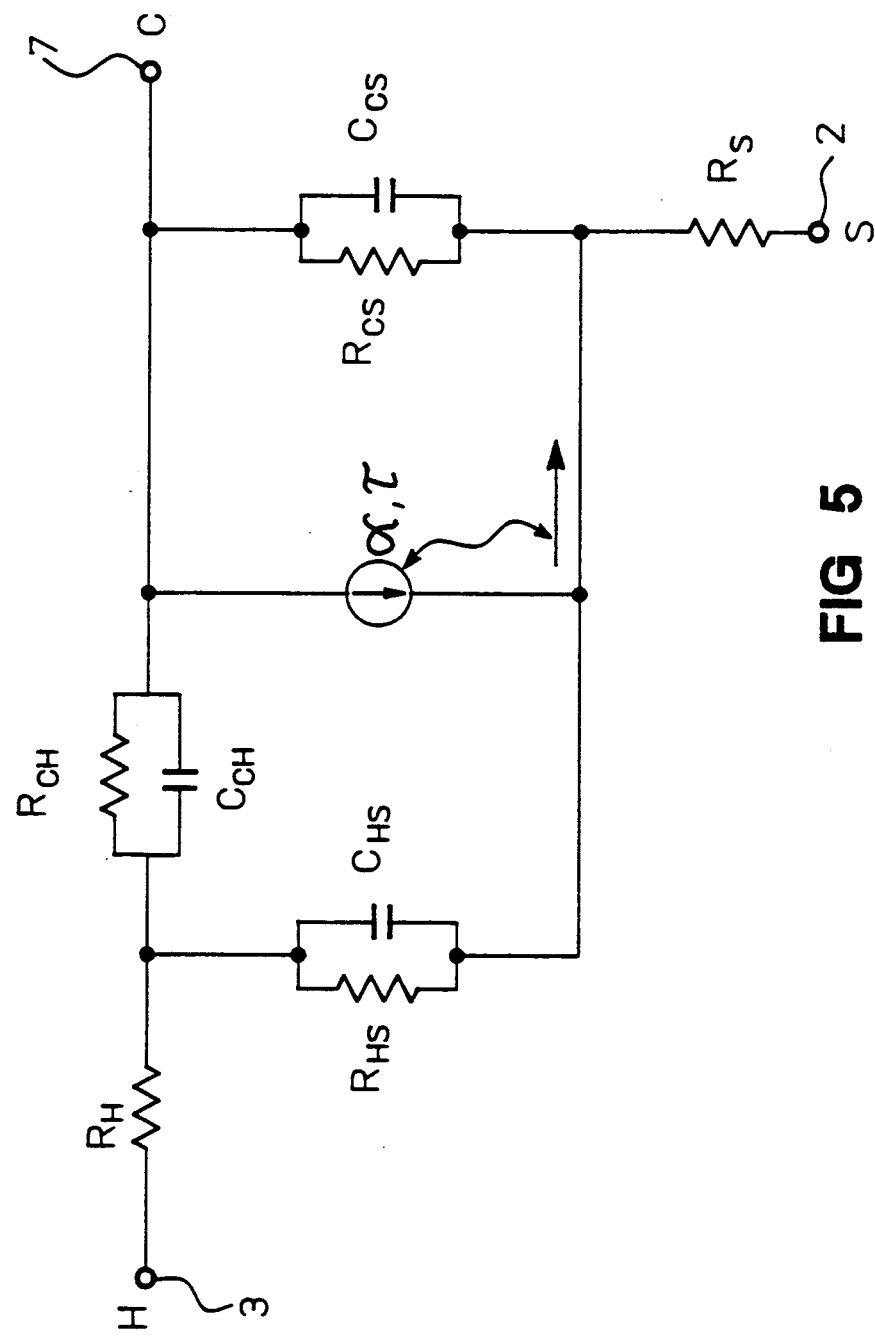
FIG. 5 shows an equivalent circuit for the embodiment of the heterostructure transistor according to the detailed description herein.

The measured transfer matrix parameters can be used to calculate an equivalent circuit for this transistor, and this equivalent circuit is shown in FIG. 5. This circuit reproduces the measurements quite well with the following circuit parameters:

$R_H = 48 \,\Omega$
$R_{HS} = -120 \,\Omega$
$C_{HS} = 150 \text{ fF}$
$R_{CH} = 143 \,\Omega$
$C_{CH} = 56 \text{ fF}$
$R_{CS} = 45 \,\Omega$
$C_{CS} = 18 \text{ fF}$
$R_S = 7.9 \,\Omega$
$\alpha = 1.10$
$\tau = 1.4 \text{ psec}$ Here $\alpha$ is the intrinsic common heater differential current gain and $\tau$ is the intrinsic time delay. This time delay includes the time required for electron heating, transfer across the barrier, and subsequent drift to the collector. The shortness of this time delay is a measure of the improved high frequency performance of this device, consistent with the values of the maximum frequencies for useful current gain and power gain of 60 GHz and 18 GHz, respectively, which are approximately twice as large as those previously achieved in CHINT devices. This dramatic increase in the operating frequency of the present device compared to previous CHINT devices is partly due to the reduced parasitic capacitance of the collector in this structure. The reduction of this collector capacitance is achieved by making the collector smaller in size and attaching it to a localized area of the drift layer. This is counter to the teaching of previous devices, which employ large collectors that substantially cover the drift or barrier layers. For example, in the Luryi structure the collector is the conducting n-GaAs substrate which extends over the surface of the $Al_xGa_{1-x}As$ drift-barrier layer. The fabrication of a CHINT structure with a small localized collector is not taught or suggested by the relevant art prior to the present invention.

Another important factor that improves the high frequency performance of the present device is the short transit time of the collector electrons, as mentioned above. This is achieved by making the barrier layer thin and providing a separate drift layer having a high drift velocity. This provision of two separate layers traversed by the hot electrons emitted from the channel is not found in, or suggested by, the previous art. For example, in the Luryi device the hot emitted electrons must migrate through a single thick barrier layer having a low electron drift velocity, which lengthens the transit time significantly.

As the barrier is made thinner, of course, there will be greater unwanted leakage of electrons from the source to the collector at room temperature. This increase in parasitic leakage is substantially removed by deepening the quantum well in the channel in the present device. Again, this improvement is not found or implied in previous devices in the relevant field.

It will be noted also that $R_{HS}$ is negative and $\alpha$ exceeds unity. This reflects the fact that the heater circuit is a negative-resistance device and that the collector current is produced by the charge injection mechanism, as in other CHINT devices. The other equivalent circuit parameters also represent physical characteristics of the structure described herein, and modifications are possible which would further improve the performance of this device.

The embodiment disclosed above has been described in terms of the GaAs/InGaAs/Al$_x$Ga$_{1-x}$As family of semiconductor materials, and the prototype has been fabricated from these materials. It will be understood, however that other families of semiconductor materials may be used in this structure provided that they meet the requirements of the invention. In particular the materials must be capable of layer fabrication, the layer surfaces must be compatible, the channel should exhibit high carrier mobility, and the drift region should exhibit high carrier drift velocity. The buffer material should substantially contain the charge carriers. The band gap of the barrier material should be larger than that of the channel and drift region materials, and the conduction band edge in the channel material should lie below the quasi-Fermi level.

It will be further understood that the above-described structure is merely illustrative of many possible specific embodiments that can be constructed in accordance with the principles of this invention, and various other structures and modifications should be designed according to this invention by persons skilled in this art without departing from the spirit and scope of the invention. While this embodiment is described as having electrons carry the charge, a structure utilizing holes as charge carriers also falls within the scope of the invention, as do structures employing combinations of electrons and holes as charge carriers. The foregoing embodiment was chosen and described in order to best explain the principles of the invention and its practical applications to thereby enable others skilled in the art to best utilize the invention in various embodiments and with various modifications as are suitable to the particular use contemplated. It is intended that the nature and scope of the invention be defined by reference to the following claims.

What is claimed is:

1. A heterostructure semiconductor device comprising:
    (a) a channel layer of semiconducting material, said channel layer containing charge carriers having substantial mobility in said material;
    (b) a substrate supporting said channel layer;
    (c) means for inhibiting migration of said charge carriers into said substrate;
    (d) a barrier layer of semiconductor material formed on and contacting said channel layer to define an interface therebetween, said barrier layer material having a band structure such that at room temperature said charge carriers are inhibited from flowing in said barrier layer material, and further such that when said charge carriers are heated in said channel layer a substantial number of said charge carriers attain sufficient energy to flow through said barrier layer material;
    (e) said channel layer having a predetermined length in a predetermined direction substantially parallel to said interface between said channel layer and said barrier layer;
    (f) a drift layer of semiconductor material formed on and contacting said barrier layer on the side opposite to said channel layer, said drift layer material having a band structure and composition such that charge carriers of sufficient energy to traverse such barrier layer can migrate through said drift layer material with substantial velocity;
    (g) means for heating said charge carriers in said channel layer to allow a substantial number to traverse said barrier layer;
    (h) a collector electrode in contact with the surface of said drift layer opposite to the surface contacting said barrier layer, said collector electrode having a length in said predetermined direction smaller than said predetermined channel layer length; and
    (i) means for biasing said collector electrode to cause said charge carriers migrating through said drift layer to flow into said collector electrode.

2. A device as recited in claim 1, wherein said means for inhibiting migration of said charge carriers into said substrate comprises a buffer layer of semiconducting material disposed between said channel layer and said substrate and in contact therewith, said buffer layer having a band structure and composition such that said charge carriers are inhibited from flowing in said buffer layer material.

3. A device as recited in claim 2, wherein said buffer layer material is comprised of Al$_{0.3}$Ga$_{0.7}$As.

4. A device as recited in claim 1, wherein said insulating substrate is comprised of electrical insulating material with respect to said charge carriers.

5. A device as recited in claim 1, wherein said channel layer material is comprised of In$_x$Ga$_{1-x}$As.

6. A device as recited in claim 5, wherein x has the value of 0.25.

7. A device as recited in claim 1, wherein said barrier layer material is comprised of Al$_x$Ga$_{1-x}$As.

8. A device as recited in claim 7, wherein x has the value of 0.1.

9. A device as recited in claim 1, wherein said drift layer material is comprised of GaAs.

10. A device as recited in claim 1, wherein said means for heating said charge carriers in said channel layer comprises:
    (a) a plurality of further electrodes in contact with said channel layer, each further electrode being separated from the other further electrodes; and
    (b) means for supplying a voltage difference between said further electrodes such that an electric field is produced in said channel layer that causes a current flow therein.

* * * * *